United States Patent
Nelson

(10) Patent No.: US 7,569,250 B2
(45) Date of Patent: Aug. 4, 2009

(54) METHOD, SYSTEM, AND APPARATUS FOR PROTECTIVE COATING A FLEXIBLE CIRCUIT

(75) Inventor: Veronica A. Nelson, Albany, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1031 days.

(21) Appl. No.: 10/848,025

(22) Filed: May 17, 2004

(65) Prior Publication Data

US 2005/0255232 A1    Nov. 17, 2005

(51) Int. Cl.
| | |
|---|---|
| B05D 5/12 | (2006.01) |
| B28B 19/00 | (2006.01) |
| B29B 15/00 | (2006.01) |
| C23C 18/00 | (2006.01) |
| C23C 20/00 | (2006.01) |
| C23C 24/00 | (2006.01) |
| C23C 26/00 | (2006.01) |
| C23C 28/00 | (2006.01) |
| C23C 30/00 | (2006.01) |
| H01C 17/06 | (2006.01) |
| H05K 3/00 | (2006.01) |

(52) U.S. Cl. ............... 427/96.4; 427/96.2; 427/211
(58) Field of Classification Search ............ 427/96.2, 427/96.4, 211, 97.3
See application file for complete search history.

(56) References Cited

U.S. PATENT DOCUMENTS

| | | | |
|---|---|---|---|
| 4,309,945 A | 1/1982 | Marion | |
| 4,635,073 A | 1/1987 | Hanson | |
| 4,827,294 A | 5/1989 | Hanson | |
| 4,847,630 A | 7/1989 | Bhaskar et al. | |
| 5,016,023 A | 5/1991 | Chan et al. | |
| 5,023,625 A | 6/1991 | Bares et al. | |
| 5,037,216 A | 8/1991 | Nubson et al. | |
| 5,401,111 A | 3/1995 | Nubson et al. | |
| 5,406,315 A | 4/1995 | Allen et al. | |
| 5,488,396 A | 1/1996 | Burket et al. | |
| 5,538,586 A | 7/1996 | Swanson et al. | |
| 5,574,489 A | 11/1996 | Cowger et al. | |
| 5,588,763 A | 12/1996 | Nubson et al. | |
| 5,608,430 A | 3/1997 | Jones et al. | |
| 5,635,964 A | 6/1997 | Burr et al. | |
| 5,637,166 A | 6/1997 | Swanson et al. | |
| 5,686,949 A | 11/1997 | Swanson et al. | |
| 5,748,215 A | 5/1998 | Swanson et al. | |
| 5,751,323 A | 5/1998 | Swanson et al. | |
| 5,833,792 A * | 11/1998 | Funaki et al. ........ | 156/244.27 |
| 5,852,459 A | 12/1998 | Pawlowski, Jr. et al. | |
| 5,896,153 A | 4/1999 | Swanson et al. | |
| 5,903,295 A | 5/1999 | Swanson et al. | |
| 5,924,198 A | 7/1999 | Swanson et al. | |
| 5,966,155 A | 10/1999 | Pawlowski, Jr. et al. | |

(Continued)

FOREIGN PATENT DOCUMENTS

JP    04243571 A  *  8/1992

*Primary Examiner*—Roberts Culbert

(57) ABSTRACT

A process for applying a protective coating to a flex circuit comprises providing a flex circuit having conductive traces on one surface and applying a protective coating in substantially a liquid state to the one surface from a first roller including the protective coating in a pattern thereon. The pattern includes at least one area on the one surface of the first roller that is not covered by the protective coating.

24 Claims, 6 Drawing Sheets

U.S. PATENT DOCUMENTS

| | | |
|---|---|---|
| 5,971,529 A | 10/1999 | Pawlowski, Jr. et al. |
| 5,980,032 A | 11/1999 | Pawlowski, Jr. et al. |
| 5,992,320 A * | 11/1999 | Kosaka et al. ............ 101/401.1 |
| 6,033,064 A | 3/2000 | Pawlowski, Jr. et al. |
| 6,137,513 A | 10/2000 | Pawlowski, Jr. et al. |
| 6,152,619 A | 11/2000 | Silverbrook |
| 6,188,417 B1 | 2/2001 | Keefe et al. |
| 6,196,739 B1 | 3/2001 | Silverbrook |
| 6,206,515 B1 | 3/2001 | Swanson et al. |
| 6,227,651 B1 | 5/2001 | Watts et al. |
| 6,231,148 B1 | 5/2001 | Silverbrook |
| 6,231,173 B1 | 5/2001 | Pawlowski, Jr. et al. |
| 6,238,033 B1 | 5/2001 | Silverbrook |
| 6,238,111 B1 | 5/2001 | Silverbrook |
| 6,270,182 B1 | 8/2001 | Silverbrook et al. |
| 6,280,011 B1 | 8/2001 | Schloeman et al. |
| 6,287,028 B1 | 9/2001 | Silverbrook |
| 6,293,658 B1 | 9/2001 | Silverbrook |
| 6,312,070 B1 | 11/2001 | Silverbrook |
| 6,318,843 B1 | 11/2001 | Feder et al. |
| 6,322,200 B1 * | 11/2001 | Feinn et al. .................... 347/58 |
| 6,323,456 B1 | 11/2001 | Murthy et al. |
| 6,328,423 B1 | 12/2001 | Wong et al. |
| 6,328,436 B1 | 12/2001 | Floyd et al. |
| 6,378,970 B1 | 4/2002 | Silverbrook |
| 6,412,993 B1 | 7/2002 | Silverbrook |
| 6,422,693 B2 | 7/2002 | Pawlowski, Jr. et al. |
| 6,464,334 B2 | 10/2002 | Lopez et al. |
| 6,475,402 B2 | 11/2002 | Nordstrom et al. |
| 6,484,521 B2 | 11/2002 | Patel et al. |
| 6,550,263 B2 | 4/2003 | Patel et al. |
| 6,582,063 B1 | 6/2003 | Chavarria et al. |

* cited by examiner

METHOD, SYSTEM, AND APPARATUS FOR PROTECTIVE COATING A FLEXIBLE CIRCUIT

BACKGROUND

Protective coatings are needed for flexible circuits to protect the circuits from exposure to an external environment. In coating a flexible circuit, portions of the flex circuit must be left exposed for connection to an electronic device, such as a print head assembly. The exposed portions should be accurately positioned to provide protection to the flex circuit, while allowing sufficient access for connection to the electronic device.

In conventional systems, protective coatings with exposed portions for accommodating electronic devices are produced using complicated and expensive coating processes such as thin film lamination, photo imaging lamination and laser cut lamination. Panel form screen printing processes have also been used but these are good for panel processing and will not work for reel to reel type processing. Flex circuits are sensitive to debris, so the coating processes require particular attention to cleanliness Therefore, a need exists for a system, method and process that can create protective coatings for flex circuits using inexpensive processes.

DETAILED DESCRIPTION

Figure 1:
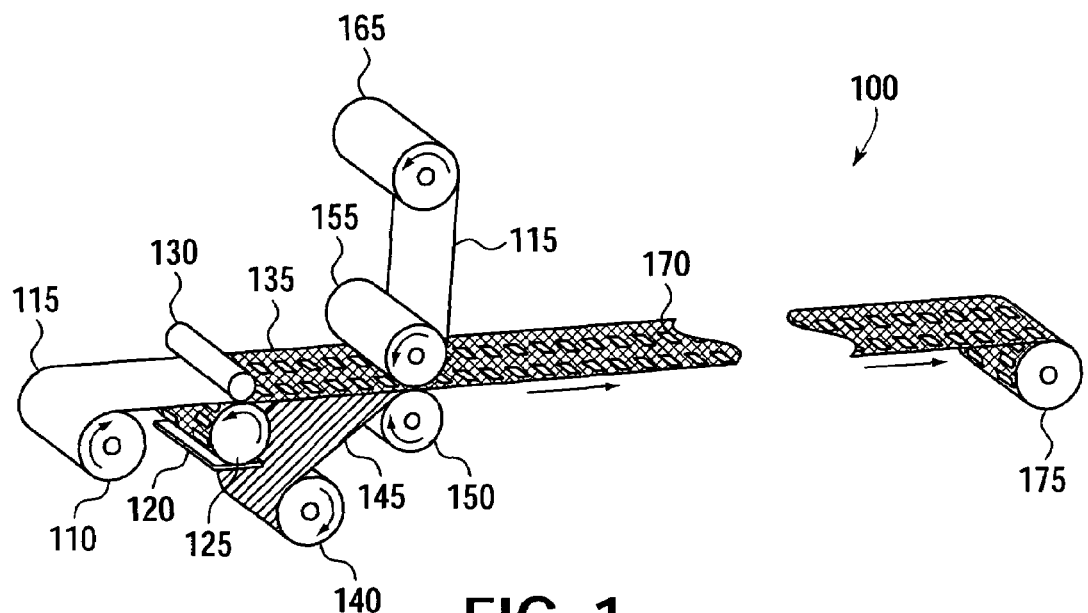
FIG. 1 is a perspective view of a system for applying a coating onto a flex circuit in accordance with one embodiment of the invention.

Referring to FIG. 1, a perspective view of a system for applying a coating onto a flex circuit in accordance with one embodiment is shown. A liner 115 is provided from a roller 110. The liner may be an adhesive tape, such as a liner coated with a PSA (pressure sensitive adhesive) or non-PSA, such as a hotmelt adhesive on one side. The adhesive may be one of any conventional high-strength adhesives configured to adhere to a liner, and enables the transfer of a protective coating to a flex circuit according to the invention.

The liner 115 is threaded between two rollers. The liner 115 is positioned between the liner collection roller 155 and the precision coating roller 125. In one embodiment, the precision coating roller for applying the coating is a cylindrical drum. The precision coating roller 125 is positioned above a trough 120, which is one embodiment of a coating bath, containing coating suspension or a molten or liquid hotmelt that will be applied as a coating first to the liner, and then transferred to the flex circuit as a protective coating. The coating is applied in a pattern to coat portions of the flex circuit, while leaving portions of the flex circuit exposed. Any number of patterns may be applied, in terms of the number of uncoated areas and their sizes.

In operation, a portion of the precision coating roller 125 is exposed to the liquid in the trough 120. Thus, as the precision coating roller 125 rotates, it takes ups the liquid from the trough and coats the liner 115 with the protective coating, which is then transferred to the flex circuit. The precision coating roller 125 rotates about an axis perpendicular to the direction that the plane of the liner 115 is moving.

The precision coating roller 125 has a pattern in its surface to that is a mirror image of a pattern of the coating that is provided on the liner 115. The precision coating roller 125 is configured with openings formed within its outer surface. These openings define the predetermined pattern on the cylindrical outer surface of the precision coating roller 125. The openings provide the area where the coating will not attach, while the coating will attach to the area on the cylindrical surface of the precision coating roller not having openings.

In operation, the precision coating roller 125, after having coating adhered thereto from trough 120, is positioned in contact against a side of a liner 115. The force used is substantially evenly distributed along the portion of the precision coating roller 125 that is in contact with surface of the liner 115. A counterforce is applied on an opposite side of the liner 115 by a counter roller 130 to allow an adequate force for transferring the protective coating from the precision coating roller 125 to the liner. In one embodiment, the counter roller 130 is positioned in a parallel axis to the axis of the cylindrical drum and rotates in a direction opposite of the direction that the precision coating roller 125 is rotating.

One advantage of this configuration is that the thickness of the coating can be controlled by adjusting the distance between the counter roller 130 and the precision coating roller 125 to match the desired thickness of the coating. The counter roller 130 may be utilized to vary the thickness of the protective coating by relative distance from precision coating roller 125. The amount of pressure applied by the counter roller 130 and the precision coating roller may also be adjusted to control the thickness of the coating. The liner 115 is thus brought through the counter roller 130 and the precision coating roller 125 and becomes a coated liner 135. The coated liner 135 then continues to move forward through the process.

In one embodiment, the precision coating roller 125 is a miter roller. A miter roller may be a cylinder where the surface has miters formed along the outside surface of the cylinder. In other embodiments, the precision coating roller may be a different configuration examples of which are discussed below.

In another embodiment, the precision coating roller can further include an edged device, such as a doctor blade, that has a length substantially equal to the width of the liner 115. The doctor blade can be incorporated into any process described herein to assist in adjusting in a coat thickness by removing excess coating material.

Also, in any of the processes described herein, a slotted die dispense system can be used in place of trough 120. In order to utilize a slotted dispense system a recirculation trough may be utilized to catch excess coating from below that could be pumped back into the slotted die feed system for reuse.

When the liner 115 and the precision coating roller 125 come into contact, the coating is applied to a surface of the liner 115 in the pattern. After portions of the liner 115 are coated, the coated liner 135 has non-coated regions from which no coating will be applied to the flex circuit. The precision coating roller 125 rotates counter clockwise as shown by the arrow.

In one embodiment, the protective coating is a thermoplastic protective coating material having adhesive properties. In this embodiment, the thermoplastic protective coating material may be applied with a miter roller, and may utilize a doctor blade to remove material beyond a certain thickness. In another embodiment, a protective coating includes a liquid suspension protective coating material having adhesive properties with a miter roller. Also, excess protective coating material may be removed from the miter roller with a doctor blade.

In other embodiments, the coating can be composed of different types of substances, such as, adhesives, thermoplastic hotmelts, coatable PSAs and other thermoset type materials and suspensions. Thus, the precision coating roller applies a protective coating to the liner in a pattern that corresponds to the desired one or more exposed portions of the flex circuit to produce a liner with a protective coating and one or more exposed portions. The coated liner 135 then transfers the coating in the pattern to a flex circuit 145.

The flex circuit 145 is provided from a roller 140. A surface of the flex circuit 145 contains conductive traces. The flex circuit 145 moves between rollers 150 and 155. Positioned between rollers 150 and 155 the coated liner 135 and the flex circuit 145 are brought into contact and the coating is transferred from the liner to the flex. The side of the flex circuit 145 with traces contacts the side of the coated liner 135 containing the coating. During contact, the flex circuit 145 attached to the coated liner 135, mating the trace side of the flex circuit or target substrate to the protective coating on the liner.

In one embodiment, the side of the flex circuit with conductive traces may be composed of a metalized polyimide film. However any material that is used for flex circuits or may be transported by a reel to reel process may be used with the processes described herein.

The flex circuit may then be nipped-in (where nipped is defined as mated to the coated substrate and threaded between two rollers) or applied to the coated liner, mating a metalized side or side with traces of the flex circuit to the protective coating on the liner. The side with traces of the flex circuit is mated to the coating on the coated liner 135, and the coating is transferred from the coated liner 135 to the flex circuit 145. The liner can then be removed and collected on a roller. Alternatively, the liner may remain with the flex circuit to prevent material blocking if material blocking is a concern with the particular coating material. The release liner can then be removed when the flex material is ready for additional processing.

In one embodiment, the liner 115 includes alignment marks (not shown) configured to facilitate accurate alignment of the openings of the coated liner 135 with portions of the flex circuit 145 to be exposed. The alignment marks would act as guides positioning the flex circuit in a desired alignment with respect to the liner. Thus, in one embodiment, the liner includes alignment marks configured to facilitate accurate alignment of the one or more exposed portions of the liner with portions of the flex circuit to be exposed. The alignment marks on the liner would be mated to corresponding alignment marks on the flex circuit to be coated. Also, other methods for reel to reel alignment may be utilized in addition to or in lieu of alignment marks.

In one embodiment, a collection roller 165 that removes the liner 115 may be utilized to remove liner 115 from the flex circuit 145. In this embodiment, the liner 115 is threaded to the collection roller 165 to accommodate the removal of the liner 115, leaving a flex circuit with a protective coating.

In another embodiment, an interleaf liner (not shown) is applied to the protective coating to prevent blocking of the one or more exposed portions of the flex circuit.

The coated flex circuit 170 continues with the coating side facing up. The coating creates openings that expose portions of the flex circuit 145 and may be used to connect or couple electrical components, such as print heads, to the traces or other devices on the flex circuit. The coated flex circuit 170 then maybe collected on a roller 175, or by other means, for storage.

When the liner is removed, the flex circuit's surface has a protective coating with selective exposed windows. The selective exposed windows have no protective coating and provide direct exposure to the flex circuit's surface. The exposed windows provide a target zone for contact to selective portions of the flex circuit's surface. The leads on the flex circuit in the exposed windows may then be welded to a device such as a print head assembly. For example, the uncoated trace area can subsequently be coupled or otherwise connected, e.g. by welding, to a print head. The one or more exposed portions of the flex circuit are configured to accommodate a print head assembly.

In another embodiment, multiple layers of coatings (not shown) may be applied to a flex circuit and configured to accommodate multiple processes. The layers may vary in composition and configuration, and may include layers such as, for example, a PO such as PET, PEN, PI or other polymer liner with release, an adhesive layer or protective coating, a bare TAB, or other material. In operation, multiple layers can be applied to a flex or equivalent circuit in order to perform multiple processes on the flex circuit. Layers may be removed after processes are performed, and various tasks may be combined into a continuous process. The thickness of the coating or coatings can be controlled with counter roller positioned above the protective coating.

Figure 2:
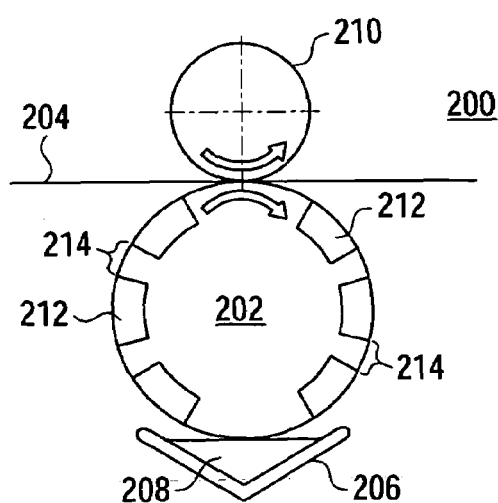
FIG. 2 is a side view of a miter roller with a trough, a pool, a liner and a counter roller in accordance with one embodiment of the invention.

Referring to FIG. 2, a side view of a precision coating roller 200 is shown. In this embodiment, the precision coating roller system 200 is a miter roller. The precision coating roller 202 is shown with a liner 204, a trough 206, a pool 208, and a counter roller 210. The precision coating roller has predetermined shaped openings, such as openings 212. The openings 212 form a pattern around the cylindrical outer surface of the precision coating roller 200. The openings define areas where the coating will be excluded, leaving the surrounding area 214 of the roller to define areas where the coating will be applied to the liner 204. The surrounding area 214 that coats the liner 204 may have miter ridges to facilitate the attachment of coating. The openings may be different sizes and shapes, depending on which design choice is desired, and may be configured to evenly apply coating to desired areas of the liner.

Figure 3:
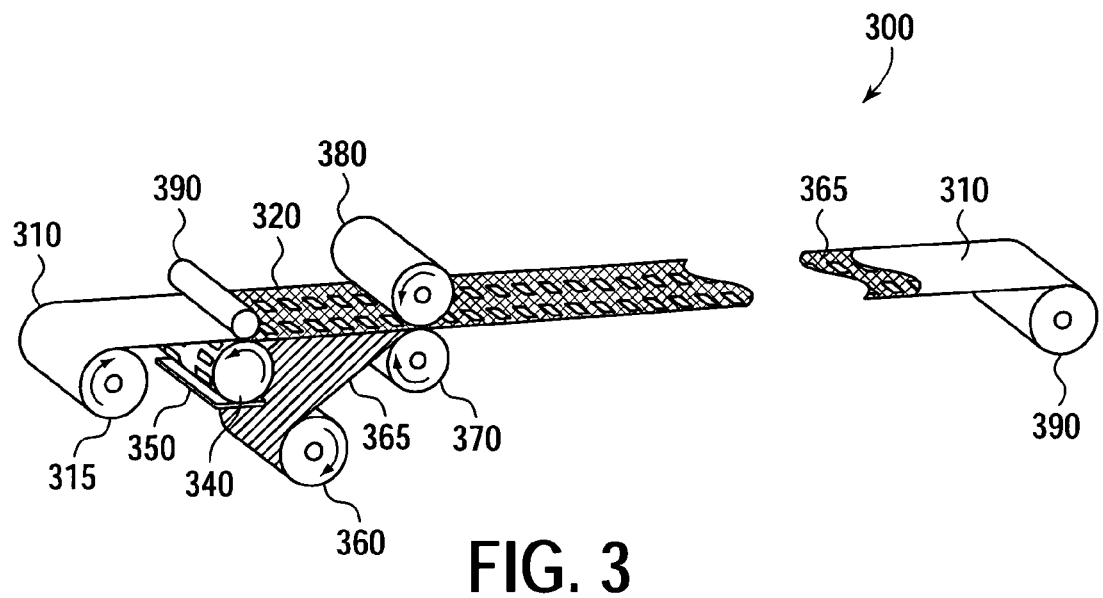
FIG. 3 is a perspective view of a system for applying a coating onto a flex circuit in accordance with another embodiment of the invention.

Referring to FIG. 3, a system 300 with a precision coating roller is shown. A flex circuit 310 or other reel to reel substrate is provided from a roller 315. The flex circuit 310 is threaded via a leader strip of interleaf material between two rollers. Interleaf material may be any inexpensive polyolefin film that is compatible with the material set and process. The flex circuit 310 is positioned between a roller 390 and the precision coating roller 340. In ones embodiment, the precision coating roller 340 is a flexography roller, but other roller configurations may be utilized depending on the application.

The precision coating roller 340 is positioned above a trough 350 containing a coating liquid. The precision coating roller 340 contains a pattern that will form a desired pattern with coating directly on the flex circuit 310. In this embodiment, the pattern on the precision coating roller 340 will have protrusions that will be covered with coating as the coating roller is immersed into trough 350. Other parts of the pattern on the precision coating roller 340 will be lowered. The precision coating roller 340 is exposed to the liquid in the trough 350 as the precision coating roller 340 rotates.

When the flex circuit 310 and the precision coating roller 340 come into contact, the coating is applied to a surface of the flex circuit 310. The coating on the protrusions 405 (FIG. 4) of the precision coating roller 340 is transferred directly to the flex circuit or substrate 310. The coated flex circuit or substrate 320 then continues to move forward through the process. It should be noted that the coated flex material may require additional processing steps that can be added on to the system, such as: additional cross linking via: e-beam, UV-cure, thermal cure; cooling steps via cylindrical cooler rollers; additional surface attributes to prevent blocking such as matte finishing; etc. An optional release liner 365 is provided from a roller 360. The liner 365 may be used if blocking is a concern.

Positioned between rollers 370 and 380 the liner 365 and coated flex circuit 320 are brought into contact. The side of the coated flex circuit 320 with traces contacts the liner 365. The liner 365 can be used to protect the side of the coated flex circuit 320 with coating. This is useful when the coated flex circuit 320 is stored in a collection roller 390.

One advantage of the processes described with respect to FIG. 3 is that few process components are used.

Figure 4:
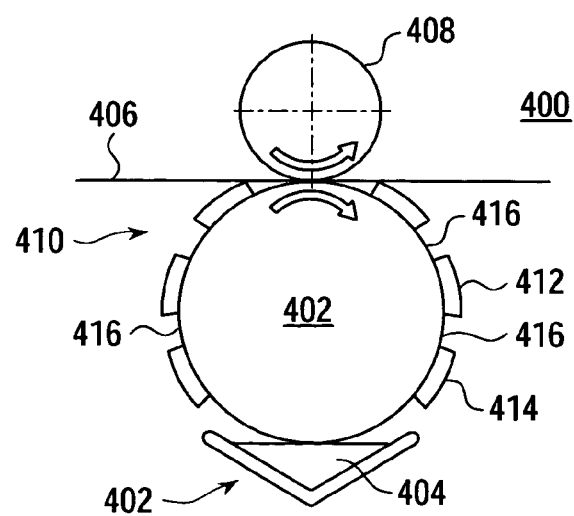
FIG. 4 is a side view of a flexography cylinder with a trough, a pool, a liner, and a counter roller in accordance with one embodiment of the invention.

Referring to FIG. 4, a side view of a flexography cylinder system 400 with a trough 402, a pool 404, a liner 406, and a counter roller 408 for use in applying a coating onto a flex circuit, in accordance with one embodiment is depicted. The flexography cylinder has predetermined shaped protrusions, such as protrusions, 412, 414, that form a pattern around the cylindrical outer surface of the precision coating roller 400. The protrusions provide the areas 416 where the coating will attach to the flexography cylinder. The coating will not attach to the area 415 on the circular surface of the precision coating roller that is recessed below the protrusions. The protrusions may be different sizes and shapes, as desired. Counter roller 408 provides a counter force and controls the thickness of the coated liner. Such a cylinder can be used to coat a liner for subsequent transfer of the coating to a flex circuit, or directly to a flex circuit.

Figure 5:
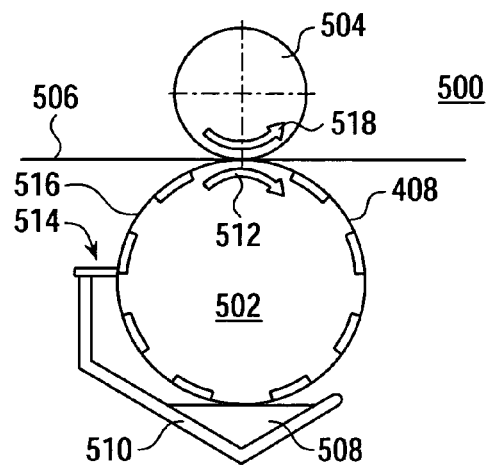
FIG. 5 is a side view of a gravure cylinder and hotmelt gravure cylinder with a doctor blade, a trough, a pool, a liner, and a counter roller in accordance with one embodiment of the invention.

Referring to FIG. 5, a side view of a gravure cylinder or hotmelt gravure cylinder system 500 is illustrated. The system includes a gravure roller 502, a counter roller 504, and a liner (or flex circuit) 506 interposed there between. Roller 502 is exposed to the liquid 508 in the trough 510 as it rotates in the direction shown with the clockwise arrow 512. As the roller 502 continues to rotate, it contacts the doctor blade 514 attached to the trough 510. The doctor blade 514 removes coating from the raised portions 516 of the cylinder, scraping off any coating greater than a predetermined thickness. As the roller 502 contacts the flex circuit 506 the counter roller 504 applies a complementary force, where it rolls in an opposite direction 518. The system illustrated shows the counter roller 504 rotating in a counter-clockwise direction, and the roller 502 rotating in a clockwise direction.

Hotmelt gravure and gravure can be use with hotmelt thermoplastic and slurry suspension type coatings, respectively. Gravure coating methods, may utilize a roller 502 that is a rigid roller engraved with a series of small cells or grooves. These rollers may be manufactured in a variety of ways such as cells that are etched into a metal layer and then plated; cells knurled into metal using a hard (sometimes diamond) tool prior and then plated; and cells can be produced by laser etching a ceramic surface of a roller. The gravure rollers are typically characterized by the number of cells per unit area of the roller surface.

Figure 6:
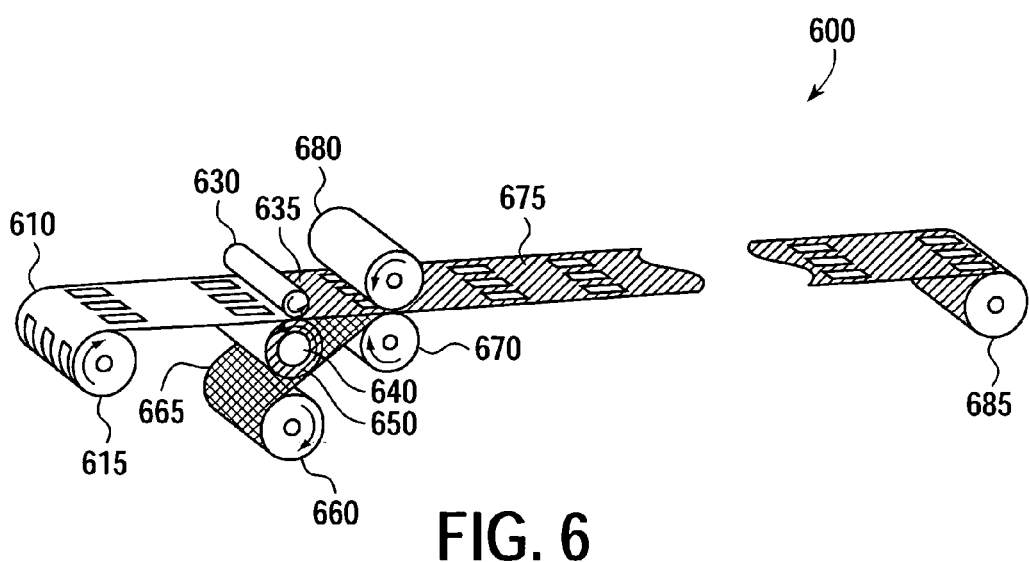
FIG. 6 is a perspective view of a system for applying a coating onto a flex circuit in accordance with a further embodiment of the invention.

It should be noted that the doctor blade 514 need not be utilized,

FIG. 6 is perspective view of a system for applying a coating onto a flex circuit in accordance with a further embodiment of the invention is illustrated. A liner 610 is threaded from a continuous roller 615 into the coating process. The liner includes pre-cut openings forming a desired pattern. The desired pattern is the pattern to be formed with the coating on a flex circuit. The pattern's openings, such as opening 620, are designed not have coating adhered thereto.

The liner 610 is positioned between the liner coat thickness roller 630 and the precision coating roller 640. A doctor blade, 667, may be incorporated to maintain the coating at a desired thickness. The precision coating roller 640 is positioned above a trough 650 containing a coating liquid. The precision coating roller 640 is exposed to the liquid in the trough 650. The precision coating roller 640 rotates in the direction of travel of the liner 610. When the liner 610 and the precision coating roller 640 come into contact, the coating is applied to a surface of the liner 610. The coated liner 635 then continues to move forward. The coated liner 635 will be used to transfer the coating to a flex circuit.

A flex circuit 665 is provided from a roller 660. The flex circuit 665 moves between rollers 670 and 680. Positioned between rollers 670 and 680, the coated liner 635 and the flex circuit 665 are brought into contact. The side of the flex circuit 665 with traces contacts the side of the coated liner 635 having the coating thereon and the coating is transferred from the coated liner 635 to the flex circuit 665. The liner 610 remains on the coated flex circuit the coated flex circuit. The coated flex circuit with liner 675 is collected and stored on collection roll 685.

The liner on the coated flex circuit 675 may be used as a mask. The liner, 620, may have an additional layer of adhesive, called attach adhesive, on the opposite side of the liner film that will not come into contact with the protective flex coating. The attach adhesive can be used for staking an additional substrate to the flex circuit. The attach adhesive on the liner may be the same adhesive or it can be a different adhesive than the covercoat adhesive. The coating has openings that expose portions of the flex circuit 635. The liner and coating can cover portions of the flex circuit 665 while exposing other portions, acting as a mask. Portions of the flex circuit 665 that could be covered might include areas containing metal traces. The uncoated leads on the flex circuit can then be used to make contact to the circuitry on the print head.

Figure 7:
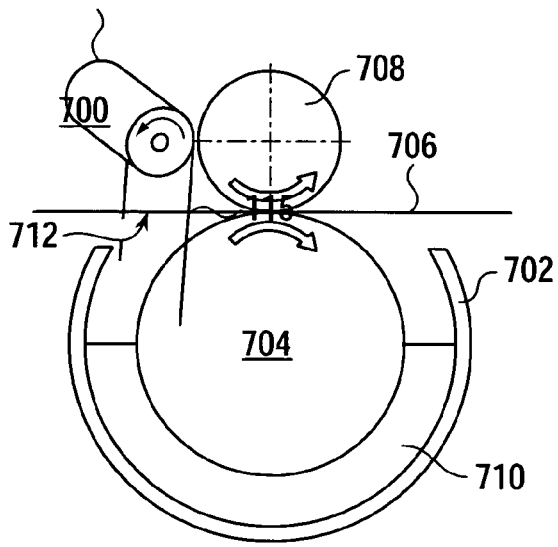
FIG. 7 is a side view of a miter roller with a trough, a pool, a liner and a counter roller for in accordance with one embodiment of the invention.

FIG. 7 is a side view of a miter roller system 700 in a cover coat bath 702. Roller 704 is shown with a liner 706 and a counter roller 708 for use in applying a coating liquid 710 onto a flex circuit. In this embodiment, the miter roller 702 has no openings or non-coated zones. The miter roller is covered by coating as it rotates through the cover coat bath. The miter roller applies a uniform layer of coating to a target surface 712. With this configuration of precision coating roller, a desired pattern on a target flex circuit can be created via a liner mask, such as that described above in FIG. 6 and below in FIG. 8.

Figure 8:
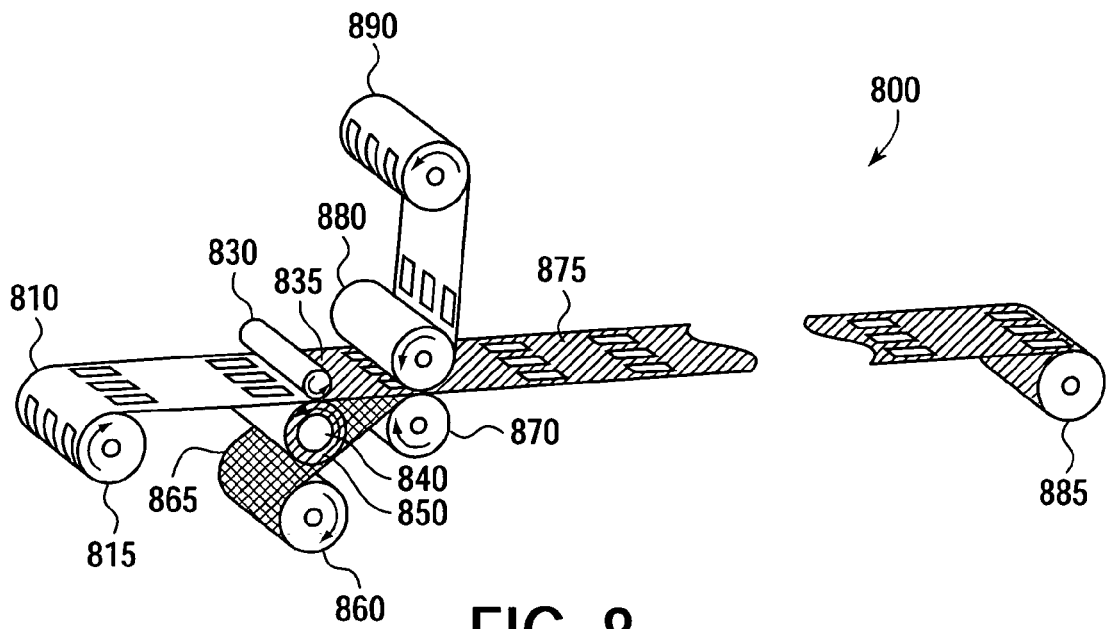
FIG. 8 is a perspective view of a system for applying a coating onto a flex circuit with a liner mask transfer coat process, in accordance with an additional embodiment of the invention.

FIG. 8 is a perspective view of a system for applying a coating onto a flex circuit with a liner mask transfer coat process where the liner is removed. A coating is then applied through the liner to the flex circuit with the precision coating roller. A liner 810 is provided from a continuous roll 815. The liner contains openings forming a desired pattern. The desired pattern is the pattern to be formed with the coating on a flex circuit. The pattern's openings, such as opening 820 will not hold coating.

The liner 810 is threaded between two rollers and continues through the process. The liner 810 is positioned between the liner coat thickness roller 830 and the precision coating roller 840. The precision coating roller 840 is positioned above a trough 850 containing a liquid. A portion of the precision coating roller 840 is exposed to the liquid in the trough 850. The precision coating roller 840 rotates about an axis parallel to the liner 810. When the liner 810 and the precision coating roller 840 come into contact the coating is applied to a surface of the liner 810. The openings of the liner 810 do not hold coating. The coated liner 835 then continues to move forward through the process. The coated liner 835 will be used to transfer the coating to a flex circuit via nip transfer coat process. The substrate or tab that is nipped into the liner may be heated via heating cylinder(s) 870 and 890. As illustrated, 870 and 890 could simply be guide cylinders, they can be chilled cylinders or they can be heated cylinders. Also, in any of the processes, additional guide, heating or chilling rollers can be added for optimal coat performance.

A flex circuit 865 is provided from a roller 860. A surface of the flex circuit 865 contains conductive traces. Positioned between coating cylinders, rollers 870 and 880, the coated liner 835 and the flex circuit 865 are brought into contact. The side of the flex circuit 865 with traces contacts the side of the coated liner 835 containing the coating. During contact, the coating is transferred from the coated liner 835 to the flex circuit 865. The liner 810 may be separated from the coated flex circuit 875 and taken up by a collection roller 890 as illustrated; or, it may be left in place as illustrated in FIG. 6 for removal at a later process if blocking is a concern. The coated flex circuit 875 continues down the conveyor belt with the coating side facing up.

Figure 9:
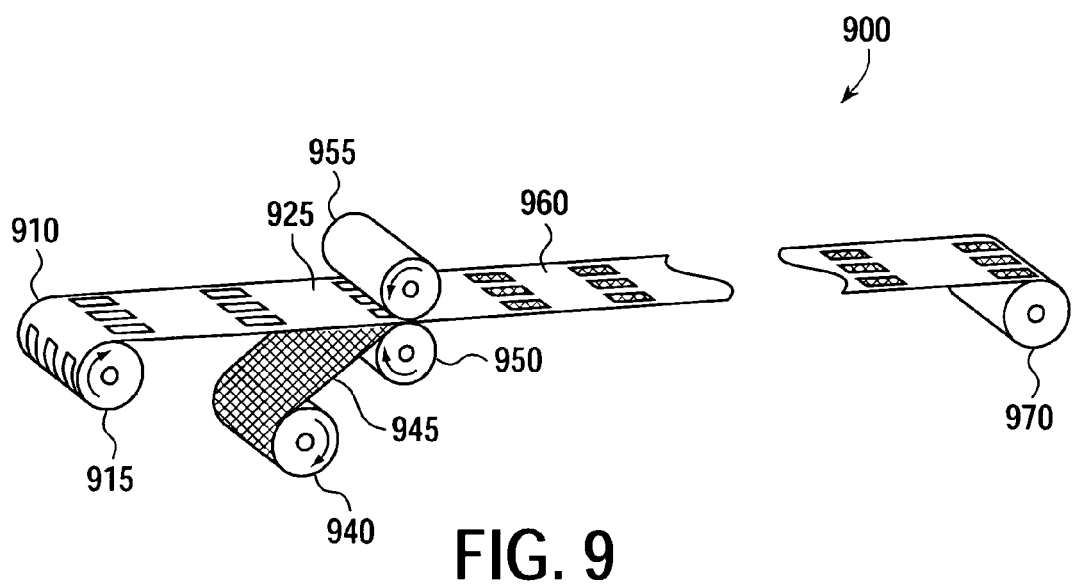
FIG. 9 is a perspective view of a system for applying a coating onto a flex circuit with a tape mask in accordance with one embodiment of the invention.

FIG. 9 is a perspective view of a system for applying a tape mask onto a substrate for sputter process. In this embodiment of the invention, a low tack tape is used to create a mask on a substrate. The tape mask can then be used as a mask for a sputter or plasma process. A tape mask 910 is provided from a continuous roll 915 to a belt. In this embodiment, the tape mask 910 is composed of a low tack tape, for ease of future removal. The adhesive on the tape can be a pressure sensitive hotmelt (PSA) or a hotmelt. The tape mask 910 contains openings forming a desired pattern where the plasma or sputtered coating will attach to the exposed areas on the target substrate. The desired pattern is the pattern to be formed with the tape mask on a substrate.

The tape mask 910 is mated to a desired substrate 945 via continuous material rolls 915 and 940. The materials from these rolls is threaded through the system between two attach rollers 950 and 955 that may or may not be heated. Alignment targets can be employed to align the patterned liner to a targeted region on the substrate 945. Another embodiment of the process in FIG. 9, includes a tape and substrate that could be mated prior to being threaded through a coating process. The taped substrate can then have selected die or laser cut regions removed in an unwind process prior to going through a selected coating process such as a plasma or sputter coating. The tape areas can be untaped/unmasked at a later process. In this embodiment, it is recommended that the tape base film be a thermally stable low shrink tape such as a polyimide (PI) or polyethylene naphthalate (PEN) or polyethylene terephthalate (PET), whichever is lowest cost and can withstand the process temperatures. The substrate 945 contacts the tape mask 910 with the liner and attaches. The substrate 945 and tape mask 910 continue through the coating system. Substrate 945 and tape mask 910 are collected and stored on collection roll 970.

Figure 10:
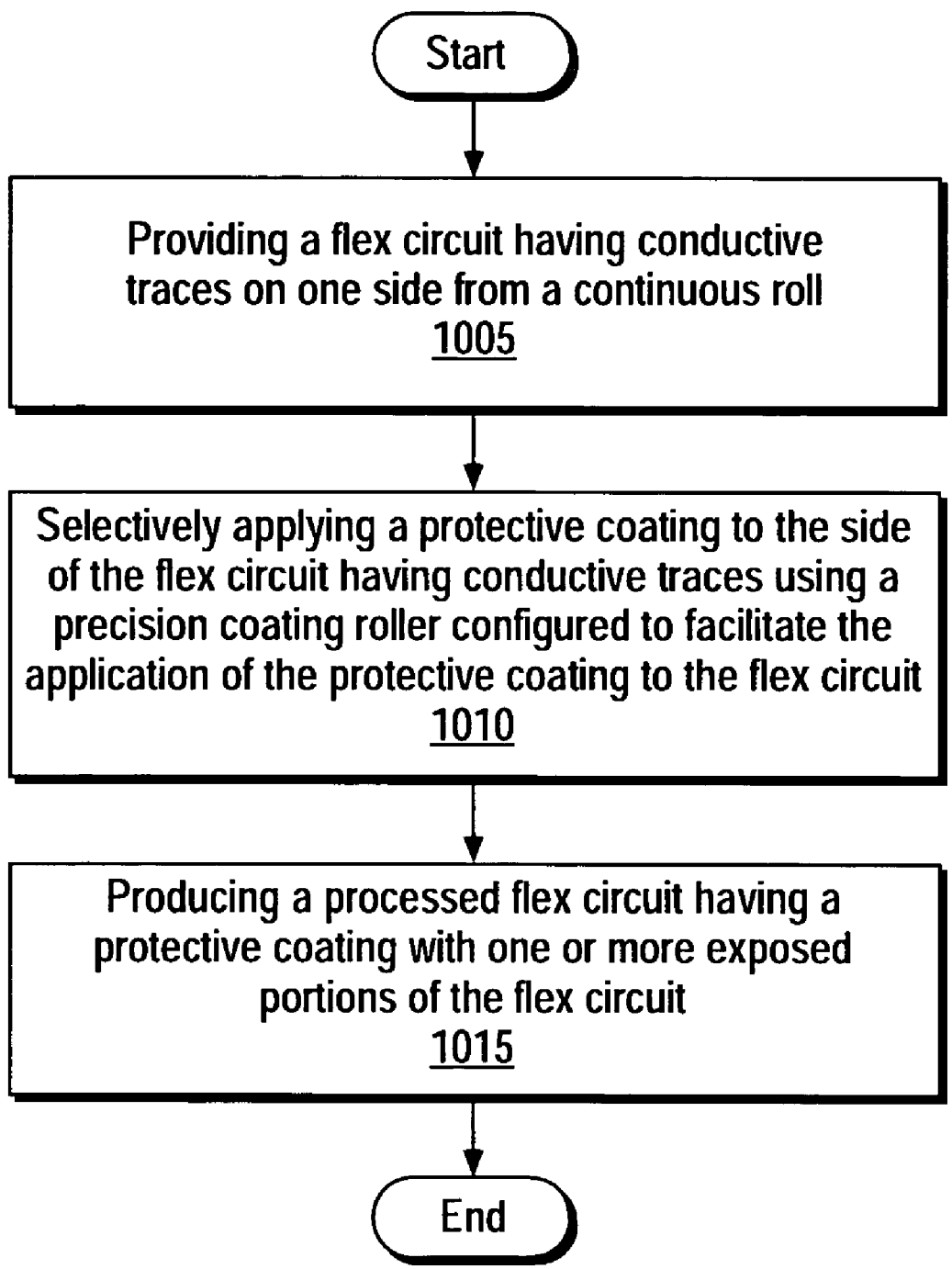
FIG. 10 is a flow chart illustrating a method of applying a coating to a flex circuit in accordance with one embodiment of the invention.

Referring to FIG. 10, one process embodying the invention is illustrated. The process provides a method for applying a protective coating onto a flex circuit. Though this process is described in the order of the steps illustrated in FIG. 10, the invention is not necessarily limited to this order. At the start of the process, a flex circuit having conductive traces on one side is provided from a continuous roller in step 1005.

Next, in step 1010, a protective coating is selectively applied to the side of the flex circuit having conductive traces using a precision coating roller configured to facilitate the application of the protective coating to the flex circuit.

Finally, in step 1015, a processed flex circuit having a protective coating with one or more exposed portions of the flex circuit is produced.

The process shown in FIG. 10 provides a method for applying a protective coating onto a flex circuit. The resulting structure may be used as a mask. The coating can mask or cover portions of the flex circuit while exposing other portions, such as portions containing leads. The masks can facilitate contact between the leads on the flex circuit and target structures such as a print head assembly. Once contact has been made between the exposed portions of the flex circuit and the target structure, the area of the unexposed portions of the flex circuit may be excised.

The invention has been described with reference to a method and apparatus for applying a coating to a flex circuit. It will be appreciated by those skilled in the art, however, that the invention has broader utility. Other embodiments may be implemented according to the invention without departing from the spirit and scope of the invention, the scope of which is to be construed in accordance with the following claims and their equivalents.

The invention claimed is:

1. A process for applying a protective coating to a flex circuit comprising:
   providing a flex circuit having conductive traces on one surface of the flex circuit;
   providing a liner having at least one opening; and,
   applying a protective coating in substantially a liquid state to the one surface from a first roller including the protective coating in a pattern thereon, wherein the pattern includes at least one area on the one surface of the first roller that is not covered by the protective coating,
   wherein applying the protective coating comprises applying the protective coating to the liner with the first roller in the predetermined pattern and then applying the liner to the one surface of the flex circuit so that the at least one opening of the liner is aligned to create at least one opening of the protective coating on the one surface.

2. A process according to claim 1, further including removing the liner after applying the protective coating to the one surface.

3. A process according to claim 1, further comprising controlling the thickness of the protective coating with a thickness roller on a side of the flex circuit opposing the one side.

4. A process according to claim 1, further comprising applying a heating roller to the flex circuit after applying the protective coating.

5. A process according to claim 1, further comprising applying a cooling roller to the flex circuit after applying the protective coating.

6. A process according to claim 1, further comprising utilizing a doctor blade to remove coating to achieve a desired coat thickness.

7. A process according to claim 1, where the protective coating is a thermoplastic material.

8. A process according to claim 1, where the protective coating is a solvent based liquid suspension adhesive.

9. A process according to claim 1, wherein the one or more exposed portions of the flex circuit are configured to accommodate a print head assembly.

10. A process according to claim 1, wherein the at least one area is configured to accommodate a print head assembly.

11. A process according to claim 1, wherein the first roller is selected from a group consisting of a mitre roller, precision roller, flexography cylinder, and a gravure cylinder.

12. A process according to claim 1, further comprising applying an interleaf liner on the one surface after applying the protective coating.

13. A process according to claim 1, where the coating is supplied to the first roller via one of a coating bath or a slotted die dispensing system.

14. A process for applying a protective coating to a flex circuit comprising:
    providing a flex circuit having conductive traces on one surface;
    providing a liner including a first liner surface;
    applying a protective coating to the first liner surface using a first roller; and,
    applying the protective coating from the first liner surface to the one surface of the flexible circuit,
    wherein providing the liner comprises providing a liner having at least one opening, and wherein applying the protective coating comprises applying the liner to the flex circuit so that the at least one opening of the liner is aligned with the at least one opening of the protective coating.

15. A process according to claim 14, farther including removing the liner to produce a coated flex circuit having the protective coating on the one surface.

16. A process according to claim 14, further comprising applying a heating roller to the flex circuit after applying the protective coating.

17. A process according to claim 14, further comprising applying a cooling roller to the flex circuit after applying the protective coating.

18. A process according to claim 14, further comprising utilizing a doctor blade to remove excess coating to achieve a desired thickness.

19. A process according to claim 14, where the protective coating is a thermoplastic material.

20. A process according to claim 14, where the protective coating is a solvent based liquid suspension adhesive.

21. A process according to claim 14, wherein the one or more exposed portions of the flex circuit are configured to accommodate a print head assembly.

22. A process according to claim 14, wherein the first roller is selected from a group consisting of a mitre roller, precision roller, flexography cylinder, and a gravure cylinder.

23. A process according to claim 14, further comprising applying an interleaf liner on the one surface after applying the protective coating.

24. A process according to claim 14, wherein applying the protective coating to the first liner surface includes the protective coating in a pattern thereon, wherein the pattern includes at least one area on the one surface of the first roller that is not covered by the protective coating.

* * * * *

UNITED STATES PATENT AND TRADEMARK OFFICE
CERTIFICATE OF CORRECTION

| | |
|---|---|
| PATENT NO. | : 7,569,250 B2 |
| APPLICATION NO. | : 10/848025 |
| DATED | : August 4, 2009 |
| INVENTOR(S) | : Veronica A. Nelson |

It is certified that error appears in the above-identified patent and that said Letters Patent is hereby corrected as shown below:

In column 10, line 7, in Claim 15, delete "farther" and insert -- further --, therefor.

Signed and Sealed this

Fifteenth Day of December, 2009

David J. Kappos
*Director of the United States Patent and Trademark Office*